United States Patent
Upadhyayula et al.

(10) Patent No.: US 7,867,819 B2
(45) Date of Patent: Jan. 11, 2011

(54) SEMICONDUCTOR PACKAGE INCLUDING FLIP CHIP CONTROLLER AT BOTTOM OF DIE STACK

(75) Inventors: Suresh Upadhyayula, San Jose, CA (US); Hem Takiar, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 59 days.

(21) Appl. No.: 11/965,702

(22) Filed: Dec. 27, 2007

(65) Prior Publication Data

US 2009/0166887 A1 Jul. 2, 2009

(51) Int. Cl.
*H01L 21/44* (2006.01)
*H01L 21/48* (2006.01)

(52) U.S. Cl. ............... 438/107; 438/108; 438/109; 257/E23.169; 257/E21.614

(58) Field of Classification Search ......... 438/107–109, 438/617; 257/E23.169, 686
See application file for complete search history.

(56) References Cited

U.S. PATENT DOCUMENTS

| | | | |
|---|---|---|---|
| 6,121,070 A * | 9/2000 | Akram | .............. 438/108 |
| 6,797,538 B2 | 9/2004 | Wallace | |
| 7,071,568 B1 * | 7/2006 | St. Amand et al. | .......... 257/777 |
| 7,342,308 B2 * | 3/2008 | Lam | ........................... 257/723 |
| 7,635,914 B2 * | 12/2009 | Palaniappan et al. | ........ 257/686 |
| 2006/0273442 A1 | 12/2006 | Tsai et al. | |
| 2007/0096284 A1 | 5/2007 | Wallace | |
| 2007/0263425 A1 * | 11/2007 | Ruckerbauer | ................ 365/149 |
| 2008/0088005 A1 * | 4/2008 | Iwata | ......................... 257/690 |

* cited by examiner

*Primary Examiner*—Nitin Parekh
(74) *Attorney, Agent, or Firm*—Vierra Magen Marcus & DeNiro LLP

(57) ABSTRACT

A semiconductor package including a plurality of stacked semiconductor die, and methods of forming the semiconductor package, are disclosed. In order to ease wirebonding requirements on the controller die, the controller die may be mounted directly to the substrate in a flip chip arrangement requiring no wire bonds or footprint outside of the controller die. Thereafter, a spacer layer may be affixed to the substrate around the controller die to provide a level surface on which to mount one or more flash memory die. The spacer layer may be provided in a variety of different configurations.

15 Claims, 8 Drawing Sheets

SEMICONDUCTOR PACKAGE INCLUDING FLIP CHIP CONTROLLER AT BOTTOM OF DIE STACK

BACKGROUND OF THE INVENTION

1. Field of the Invention

Embodiments of the present invention relate to a semiconductor package including a plurality of stacked semiconductor die, and methods of forming the semiconductor package.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

A cross-sectional side view and a top view of a conventional semiconductor package 20 are shown in FIGS. 1 and 2 (without molding compound in FIG. 2). Typical packages include a plurality of semiconductor die, such as flash memory die 22 and controller die 24, affixed to a substrate 26. A plurality of die bond pads 28 may be formed on the semiconductor die 22, 24 during the die fabrication process. Similarly, a plurality of contact pads 30 may be formed on the substrate 26. Die 22 may be affixed to the substrate 26, and then die 24 may be mounted on die 22. All die may then be electrically coupled to the substrate by affixing wire bonds 32 between respective die bond pad 28 and contact pad 30 pairs. Once all electrical connections are made, the die and wire bonds may be encapsulated in a molding compound 34 to seal the package and protect the die and wire bonds.

In order to most efficiently use package footprint, it is known to stack semiconductor die on top of each other, either completely overlapping each other, or with an offset as shown in FIGS. 1 and 2. In an offset configuration, a die is stacked on top of another die so that the bond pads of the lower die are left exposed. An offset configuration provides an advantage of convenient access of the bond pads on each of the semiconductor die in the stack.

In packages including a plurality of stacked semiconductor die, space within the semiconductor package for wirebonding is at a premium. In particular, where there are multiple stacked flash memory die 22, it may become difficult to find space on the substrate for all of the contact pads required to make all of the necessary electrical connections. The number of die bond pads, contact pads and wire bonds in an actual semiconductor package would be many more than is shown in FIGS. 1 and 2. The number shown in FIGS. 1 and 2 is greatly reduced for the sake of clarity. Moreover, FIGS. 1 and 2 include only a pair of memory die 22. There may be more than that in the die stack, making it even harder to find room for all of the required wire bonds.

The controller die 24 is generally smaller than the memory die 22. Accordingly, the controller die 24 is conventionally placed at the top of the memory die stack. However, where there is a plurality of stacked memory die, it is often difficult to find space on the substrate for all of the required controller die wire bonds. In FIGS. 1 and 2, the memory die 22 all bond out to a single, side edge of the substrate, and the controller die wire bonds 28a are shown bonded to a separate row of contact pads 30 along that edge. However, in certain configurations, there may not be room on the substrate for adding a separate row of contact pads. Moreover, in FIGS. 1 and 2, a second row of die bonds pads 28b along an adjacent edge of the controller die 24 are shown wire bonded to a top edge of the substrate. However, in certain configurations, the memory die take up all or substantially all of the width of the substrate, and there is no room for wire bonding the controller die along the top edge of the substrate.

One conventional method of handling this problem is by including a redistribution layer within the controller die to effectively reposition the controller die bond pads to locations along the die stack having greater access to available contact pad spaces on the substrate. However, given the small size of the controller die, this is not always a feasible solution. Moreover, fabrication of a redistribution layer adds time, cost and complexity to the fabrication of the controller die.

SUMMARY OF THE INVENTION

Embodiments of the invention, roughly described, relate to a semiconductor package including a plurality of stacked semiconductor die, and methods of forming the semiconductor package. In order to ease wirebonding requirements on the controller die, the controller die may be mounted directly to the substrate in a flip chip arrangement requiring no wire bonds or footprint outside of the controller die. Thereafter, a spacer layer may be affixed to the substrate around the controller die to provide a level surface on which to mount one or more flash memory die. The spacer layer may be provided in a variety of different configurations, but the footprint of the spacer layer and controller die may be approximately the same size as the flash memory die to be mounted thereon.

As indicated, one or more flash memory die may be mounted on top of the controller and spacer layer. Where a plurality of memory die are used, they may be affixed in a offset or completely overlapping relationship to each other. Where completely overlapping, the memory die may be separated from each other by a spacer layer. The flash memory die may then be wirebonded out to the substrate. Thereafter, the package may be encapsulated.

In an alternative embodiment, a controller die may be bonded to the substrate in a flip chip arrangement as described above, and then a memory die may be mounted directly on the substrate next to the controller die. The memory die may be electrically coupled via wire bonds or as a flip chip. Thereafter, one or more additional memory die may be mounted on top of the controller die and the bottom memory die. These one or more additional memory die may be wire bonded to the substrate as described above, and then the package may be encapsulated and singulated as described above.

In a further alternative embodiment, a memory die may be mounted and coupled to the substrate as a flip chip. Thereafter, one or more additional memory die may be mounted on top of the flip chip memory die and wire bonded to the substrate. A controller die may then be mounted to a top of the memory die stack and wire bonded to the substrate.

DETAILED DESCRIPTION

Embodiments will now be described with reference to FIGS. 3 through 20, which roughly described, relate to a stacked semiconductor package assembly. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

An embodiment of the present invention will now be explained with reference to the flowchart of FIG. 3 and the top and side views of FIGS. 4 through 14. Although FIGS. 4 through 14 each show an individual package 100, or a portion thereof, it is understood that the package 100 may be batch processed along with a plurality of other packages 100 on a substrate panel to achieve economies of scale. The number of rows and columns of packages 100 on the substrate panel may vary.

The substrate panel begins with a plurality of substrates 102 (again, one such substrate is shown in FIGS. 4 through 14). The substrate 102 may be a variety of different chip carrier mediums, including a printed circuit board (PCB), a leadframe or a tape automated bonded (TAB) tape. Where substrate 102 is a PCB, the substrate may be formed of a core having a top conductive layer and a bottom conductive layer. The core may be formed of various dielectric materials such as for example, polyimide laminates, epoxy resins including FR4 and FR5, bismaleimide triazine (BT), and the like. Although not critical to the present invention, the core may have a thickness of between 40 microns ($\mu$m) to 200 $\mu$m, although the thickness of the core may vary outside of that range in alternative embodiments. The core may be ceramic or organic in alternative embodiments.

The conductive layers surrounding the core may be formed of copper or copper alloys, plated copper or plated copper alloys, Alloy 42 (42Fe/58Ni), copper plated steel, or other metals and materials known for use on substrate panels. The conductive layers may have a thickness of about 10 $\mu$m to 25 $\mu$m, although the thickness of the layers may vary outside of that range in alternative embodiments.

Figure 1:
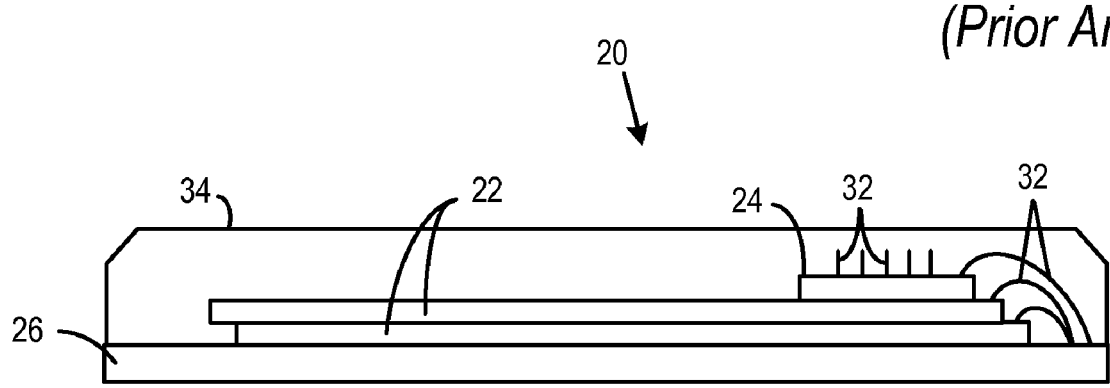
FIG. 1 is a cross-sectional side view of a conventional semiconductor package.
Figure 2:
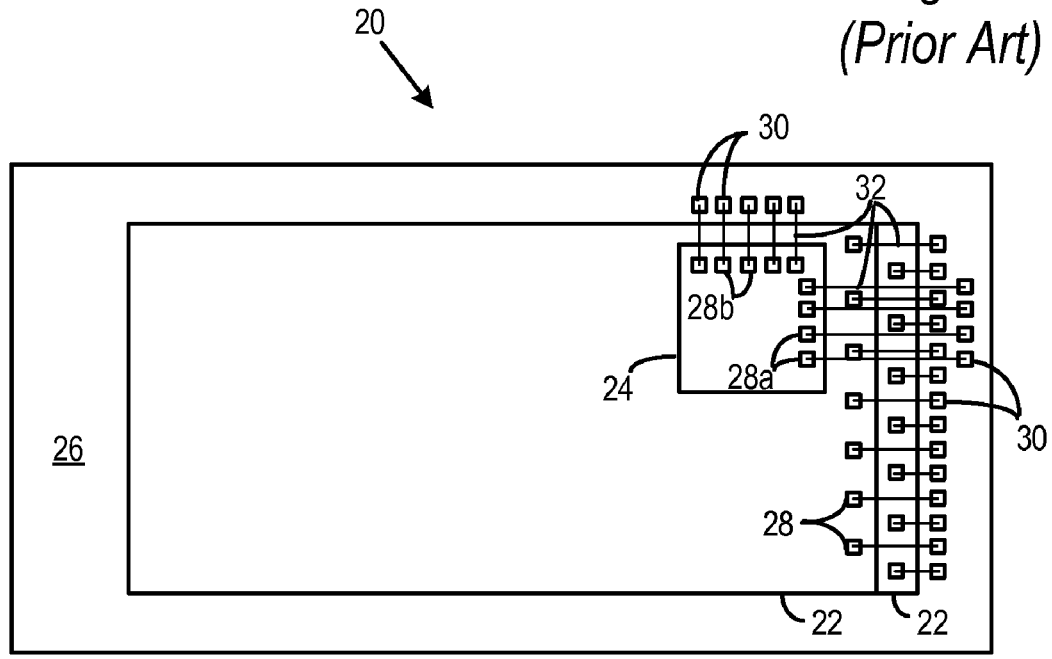
FIG. 2 is a top view of a conventional substrate and wire bonded semiconductor die.
Figure 3:
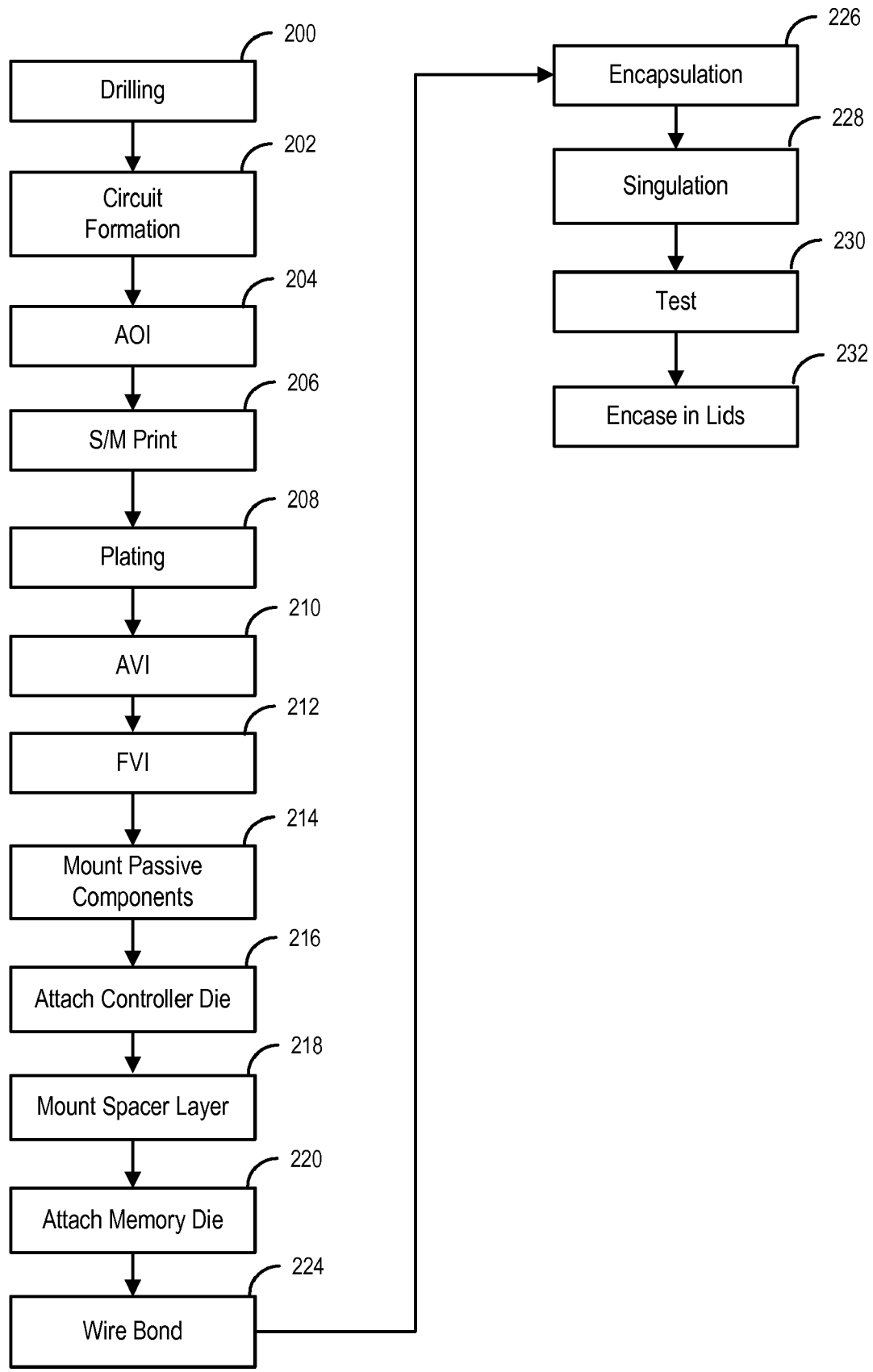
FIG. 3 is a flowchart of the overall fabrication process of semiconductor package according to embodiments of the present invention.

FIG. 3 is a flowchart of the fabrication process for forming a stacked semiconductor assembly according to embodiments of the present invention. In a step 200, the substrate 102 is drilled to define through-hole vias 104 in the substrate 102. The vias 104 shown are by way of example, and the substrate may include many more vias 104 than is shown in the figures, and they may be in different locations than is shown in the figures. Conductance patterns are next formed on one or both of the top and bottom conductive layers in step 202. The conductance pattern(s) may include electrical traces 106 and contact pads 108. The traces 106 and contact pads 108 shown are by way of example, and the substrate 102 may include more traces and/or contact pads than is shown in the figures, and they may be in different locations than is shown in the figures. In accordance with an aspect of the invention, a cluster of contact pads 108 may be formed for mating with a controller die in a flip chip configuration as explained hereinafter.

In embodiments, the finished semiconductor package 100 assembly may be used as an LGA package including contact fingers for removably coupling the finished package 100 within a host device. As such, the conductance pattern may also include defined contact fingers on a side of the substrate not shown in FIG. 4. The conductance pattern on the top and/or bottom surfaces of the substrate 102 may be formed by a variety of known processes, including for example various photolithographic processes.

Referring again to FIG. 3, the substrate 102 may then be inspected in an automatic optical inspection (AOI) in step 204. Once inspected, a solder mask may be applied to the substrate in step 206. After the solder mask is applied, the contact pads, contact fingers and any other solder areas on the conductance patterns may be plated with a Ni/Au, Alloy 42 or the like in step 208 in a known electroplating or thin film deposition process. The substrate 102 may then be inspected and tested in an automated inspection process (step 210) and in a final visual inspection (step 212) to check electrical operation, and for contamination, scratches and discoloration. Assuming the substrate 102 passes inspection, passive components may next be affixed to the substrate in a step 214. The one or more passive components may include for example one or more capacitors, resistors and/or inductors, though other components are contemplated.

Figure 4:
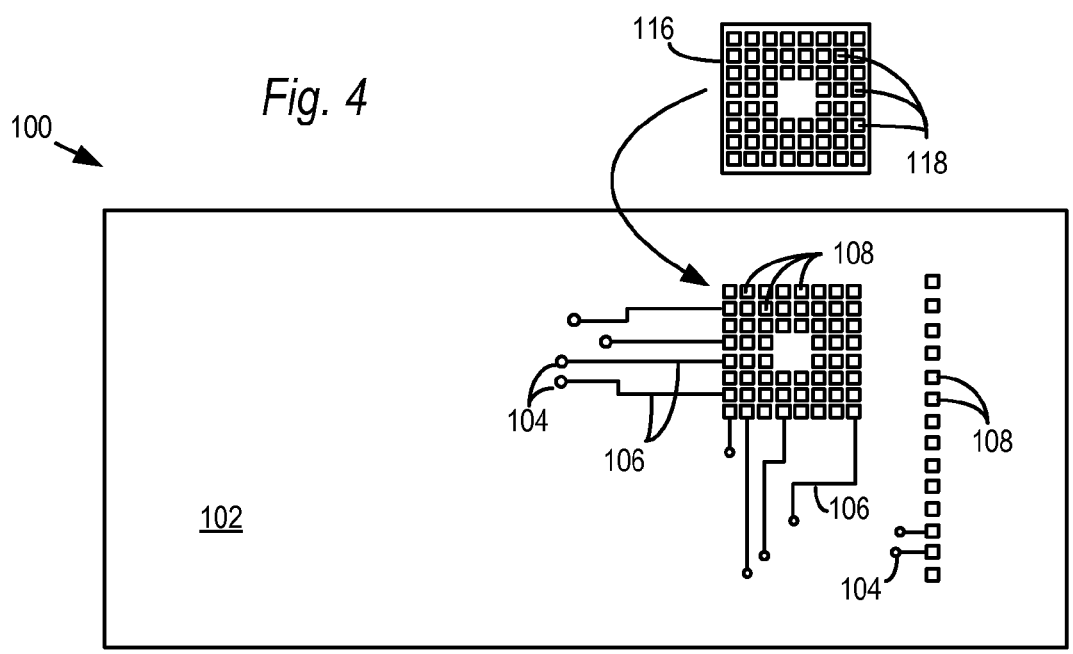
FIG. 4 is a top view of a semiconductor package at a first step in the fabrication process including a conductance pattern defined on a substrate.
Figure 5:
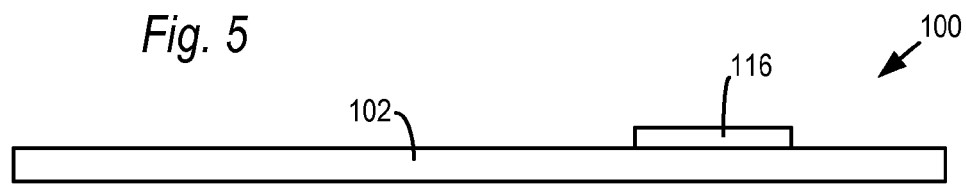
FIG. 5 is a side view of a semiconductor package at a second step in the fabrication process including a controller die mounted to the substrate in a flip chip arrangement.
Figure 6:
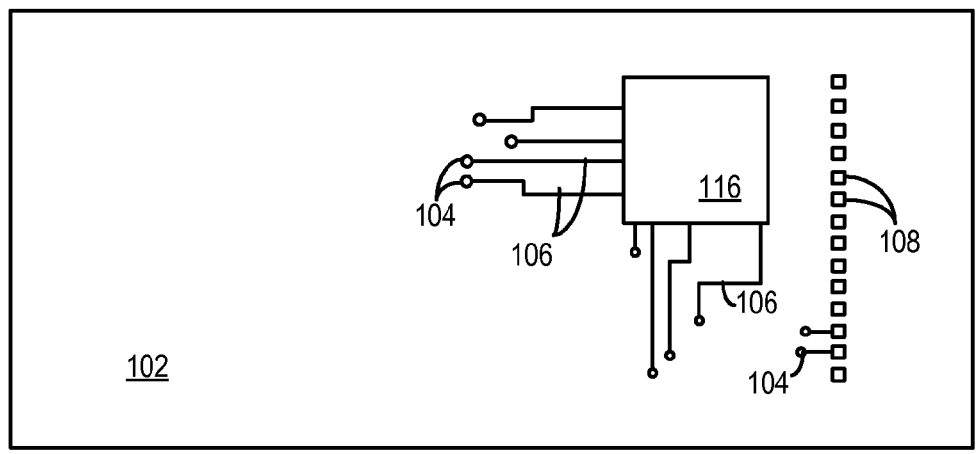
FIG. 6 is a top view of a semiconductor package at a second step in the fabrication process including a controller die mounted to the substrate in a flip chip arrangement.

Referring now to FIG. 4, in accordance with an aspect of the present invention, a controller die 116, such as for example an ASIC, may be affixed and electrically coupled to the substrate 102 in a flip chip bonding process in step 216. In particular, the controller die 116 may include a cluster of die bond pads 118 configured to mate with the cluster of contact pads 108 on the substrate. There may be many more die bond pads and contact pads in the respective clusters than are shown in FIG. 4. The die bond pads 118 may each include solder bumps, which may be adhered to the bond pads 118 during a semiconductor wafer fabrication step for forming controller die 116.

In order to attach the controller die 116 to substrate 102, the controller die 116 is inverted from the position shown in FIG. 4 so that the cluster of die bond pads 118 mate with the cluster of contact pads 108 on substrate 102. The solder bumps are then melted and cured in a reflow process, for example ultrasonic welding. Optionally, an electrically-insulating adhesive may be underfilled into any space between the controller die 116 and the substrate 102 around the solder bumps to provide a stronger mechanical connection, provide a heat bridge, and to reduce stress on the solder joints due to differential heating of the chip and the substrate. Mounting the controller die 116 on the substrate using a flip chip configuration alleviates the difficulties of the prior art in wire bonding a controller die at the top of the die stack to the substrate.

Figure 7:
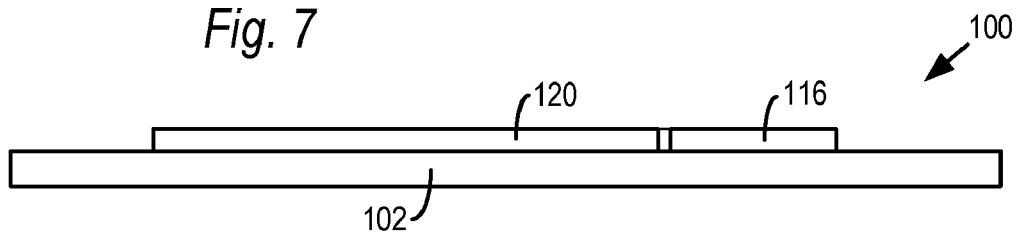
FIG. 7 is a side view of a semiconductor package at a third step in the fabrication process including a controller die and spacer layer mounted to the substrate.
Figure 8:
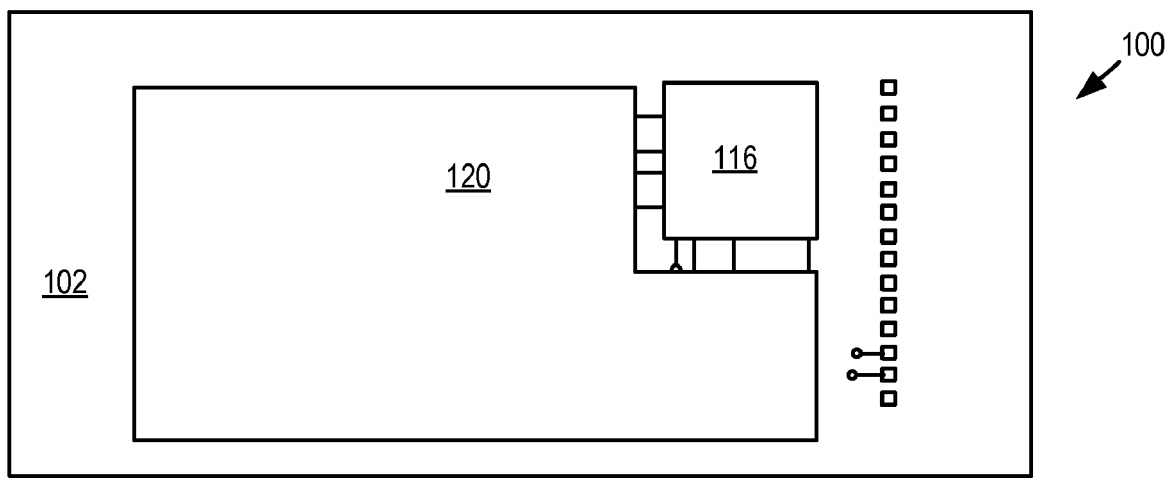
FIG. 8 is a top view of a semiconductor package at a third step in the fabrication process including a controller die and spacer layer mounted to the substrate.

Referring now to the side and top views of FIGS. 7 and 8, in step 218 a spacer layer 120 may be mounted on the substrate 102. The spacer layer 120 is provided so that there is a level surface on which to mount the one or more memory die as explained hereinafter. Thus, the height of the spacer layer 120 above the surface of the substrate 102 should be equal to or approximately equal to the height of the controller die 116 above the surface of the substrate 102. The spacer layer may be made out of a variety of materials, such as silicon with a top metal or PCB materials such as FR5 or BT.

The size and shape of the spacer layer 120 may vary in embodiments. In general, the spacer layer 120, together with the controller die 116, provides a support surface for the memory die. Thus, the combined footprint of the spacer layer 120 and controller die 116 may be approximately equal to the footprint of the memory die. It is understood that the combined footprint of the spacer layer 120 and controller die 116 may be larger than the footprint of the memory die. And it is understood that the combined footprint of the spacer layer 120 and controller die 116 may be slightly smaller than the footprint of the memory die, with the caveat that the combined footprint of the spacer layer and controller not be so small that the memory die is at risk of cracking during the encapsulation process. In particular, during the encapsulation process, large forces are exerted against the semiconductor die. If too large an area of the memory die hangs unsupported over the edges of the spacer layer and controller die, the memory die may crack under this pressure. In embodiments, the combined footprint of the spacer layer and controller may be sufficiently large to prevent cracking of the memory die during the encapsulation process.

Figure 9:
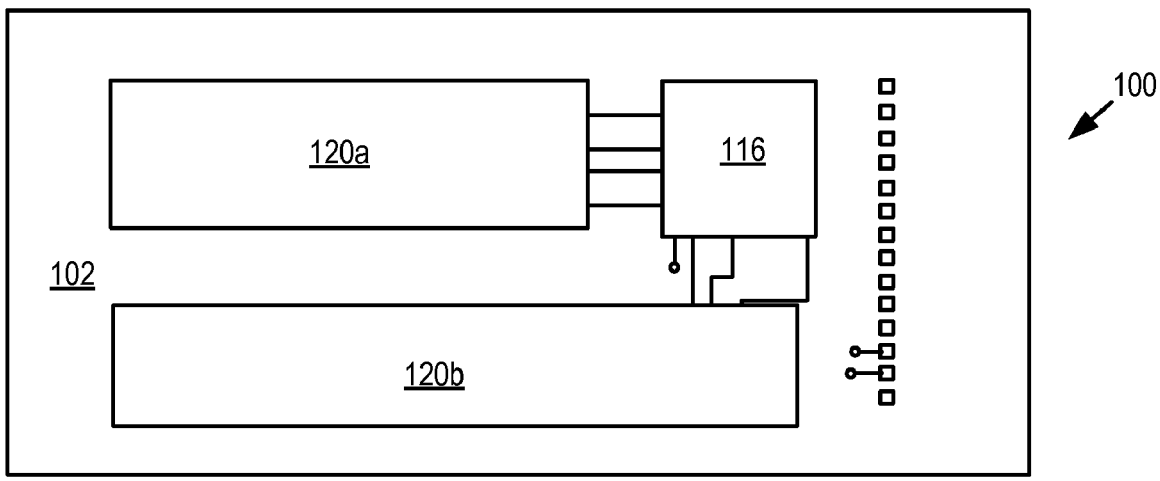
FIGS. 9 through 11 are top views of a semiconductor package including alternative configurations of spacer layers mounted on the substrate.
Figure 10:
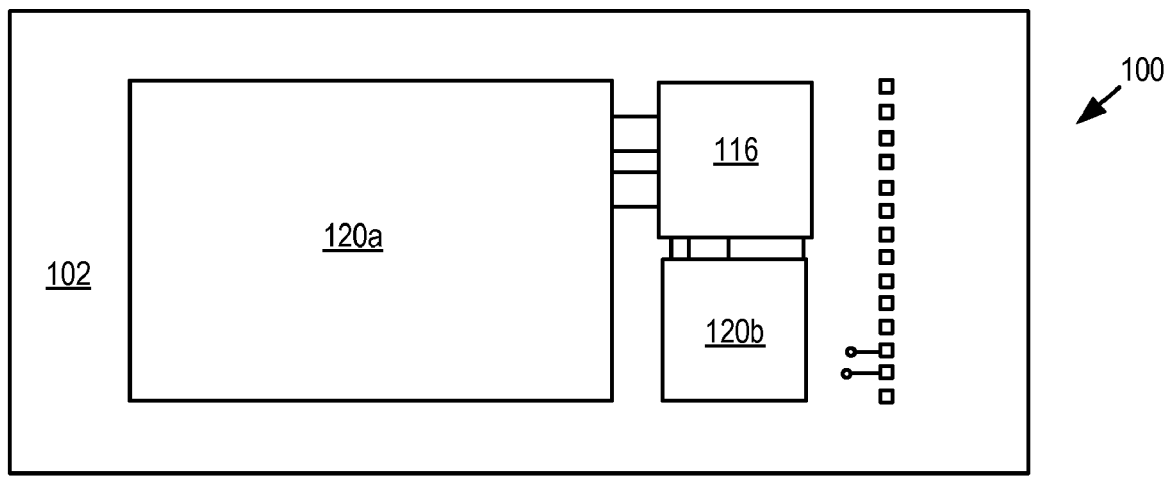
Figure 11:
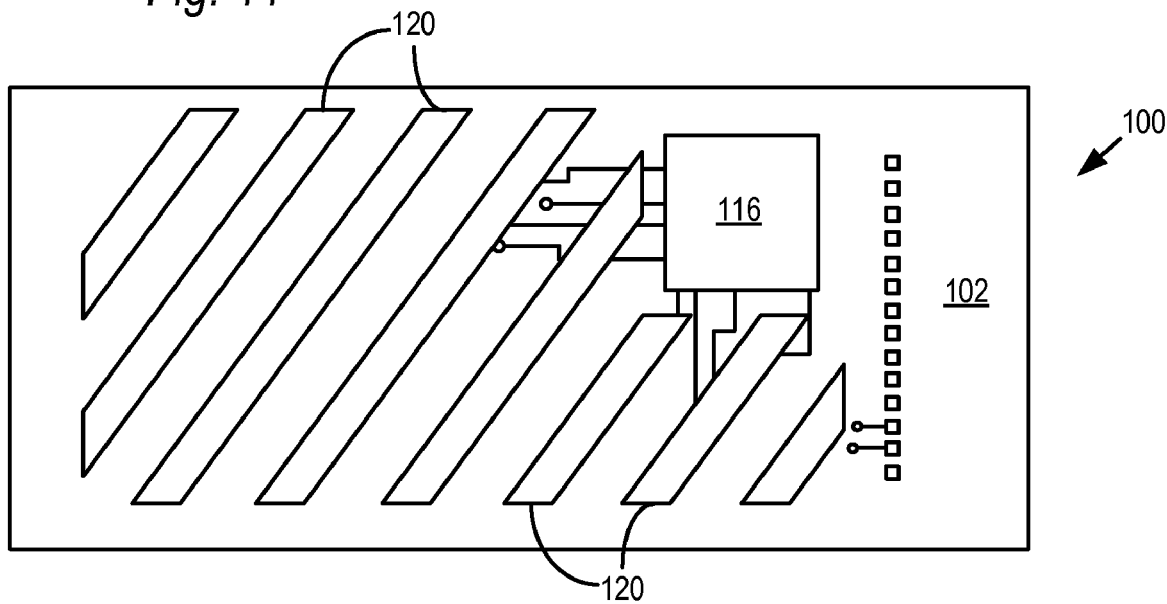

FIG. 8 shows an embodiment where the spacer layer 120 has a footprint which is roughly the same size as the memory die, with a corner missing from the spacer layer 120 where the controller die 116 is located. There may be a slight gap between the edges of the spacer layer 120 and the controller die, as shown in FIG. 8, or the edges of the spacer layer may lie in contact with the edges of the controller die 116. It is understood that spacer layer 120 may be provided in a variety of other configurations. FIG. 9 shows a configuration where spacer layer 120 is separated into two separate sections 120a and 120b running lengthwise along substrate 102. FIG. 10 shows a configuration where spacer layer 120 is separated into two separate sections 120a and 120b running widthwise across substrate 102. FIG. 11 is a further embodiment where the spacer layer is divided into a plurality of sections which together with the controller die 116, have at least approximately the same footprint as the memory die. The plurality of sections are shown as diagonal strips. The plurality of sections may alternatively be horizontal strips across the length of the substrate, vertical strips across the width of the substrate, or further divided into discrete areas (such as for example smaller squares or circles) arranged in a matrix of rows and columns on the substrate.

Figure 12:
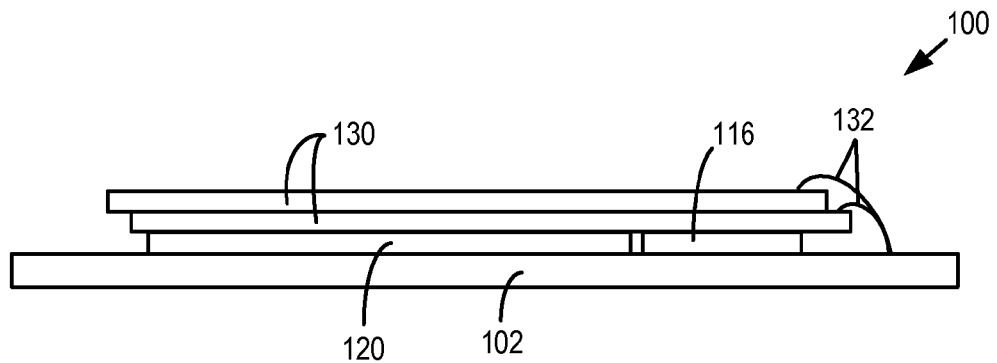
FIG. 12 is a side view of a semiconductor package at a third step in the fabrication process including flash memory die mounted to the substrate.
Figure 13:
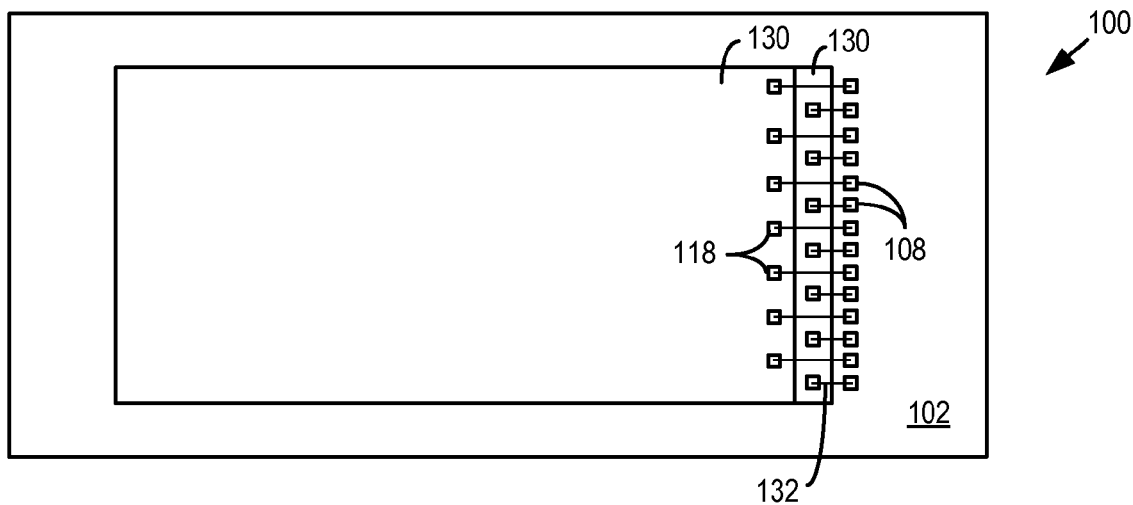
FIG. 13 is a top view of a semiconductor package at a third step in the fabrication process including flash memory die mounted to the substrate.

After the spacer layer 120 is affixed to substrate 102, one or more memory die 130 may be mounted on top of the spacer layer 120 and controller die 116 in a step 220 as shown in FIGS. 12 and 13. The memory die 130 may be for example flash memory chips (NOR/NAND), though other semiconductor die are contemplated in alternative embodiments. As described above, the memory die 130 may be smaller, the same size or slightly larger than the footprint of the spacer layer and controller die together. The memory die 130 may be mounted in a known die attach process using for example a die attach adhesive.

Once the memory die 130 are mounted, the memory die may be wire bonded to the substrate 102 in a step 224 using wire bonds 132 as shown in FIGS. 12 and 13. In particular, die bond pads 134 on the memory die 130 may be electrically coupled to the exposed contact pads 108 on the substrate in a known wire bond process. There may be many more die bond pads, contact pads and/or wire bonds than are shown in FIGS. 12 and 13. Moreover, while all of the wire bonds are shown extending from a single edge of the memory die 130, it is understood that die 130 may have bond pads and wire bonds around two or more edges. While two memory die 130 are shown in the figures, there may be a single memory die or more than two memory die in further embodiments of the present invention.

FIGS. 12 and 13 show the memory die 130 stacked in an offset arrangement on the spacer layer 120 and controller die 116. The offset allows electrical leads to be connected to each of the memory die in the stack, at the edges of the die. Alternatively, the memory die could be stacked in a completely overlapping configuration and be separated by silicon spacer between the memory die as is known in the art.

Figure 14:
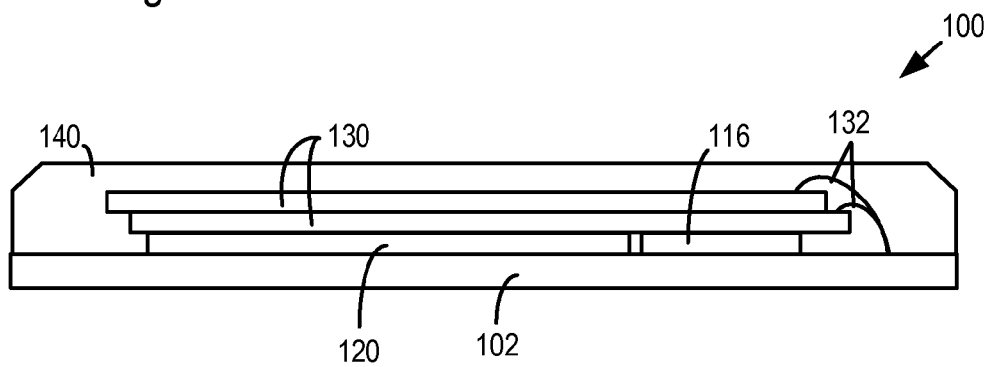
FIG. 14 is a side view of a semiconductor package at a fourth step in the fabrication process including an encapsulated semiconductor package.

Referring now to FIG. 14, the spacer layer 120, die 116, 130 and wire bonds 132 may next be encapsulated in a mold compound 140 in a step 226. Mold compound 132 may be an epoxy such as for example that available from Sumitomo Corp. and Nitto-Denko Corp., both having headquarters in Japan. Other mold compounds from other manufacturers are contemplated. The mold compound may be applied according to various known processes, including by transfer molding or injection molding techniques.

After the packages on the panel are encapsulated in step 226, the respective packages may be singulated in step 228 from the panel to form the finished semiconductor package 100 shown in FIG. 14. Each semiconductor package 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor package 100, it is understood that semiconductor package 100 may have shapes other than rectangular and square in further embodiments of the present invention.

Once cut into packages 100, the packages may be tested in a step 230 to determine whether the packages are functioning properly. As is known in the art, such testing may include electrical testing, burn in and other tests. Optionally, in step 232, the finished packages may be encased within a lid (not shown).

In the above described embodiments, the controller die is bonded to the substrate in a flip chip arrangement and then the one or more memory die are stacked on top of the controller die. In an alternative embodiment shown in FIG. 15, a controller die 116 may be bonded to the substrate 102 in a flip chip arrangement as described above, and then a memory die 130a may be mounted directly on the substrate next to the controller die. The memory die 130a may then be wire bonded to contact pads on the substrate 102 as described above. In this embodiment, either the memory die 130a has a shorter length, or the length of the substrate is increased, so that the memory die 130a and controller die 116 may lie side-by-side with each other on the substrate 102.

Figure 16:
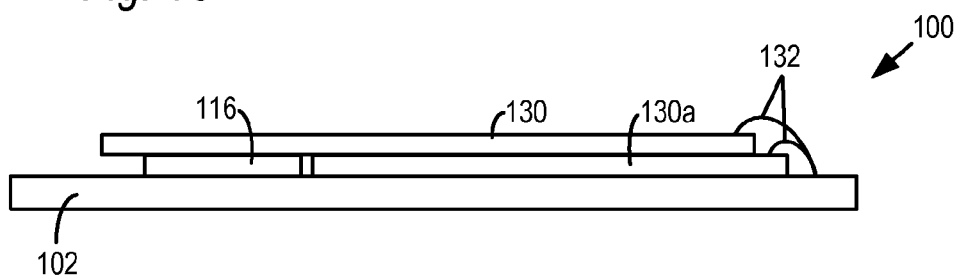
FIG. 16 is a side view of a semiconductor package according to the embodiment of FIG. 15, further including a second memory die mounted atop the controller and first memory die.
Figure 17:
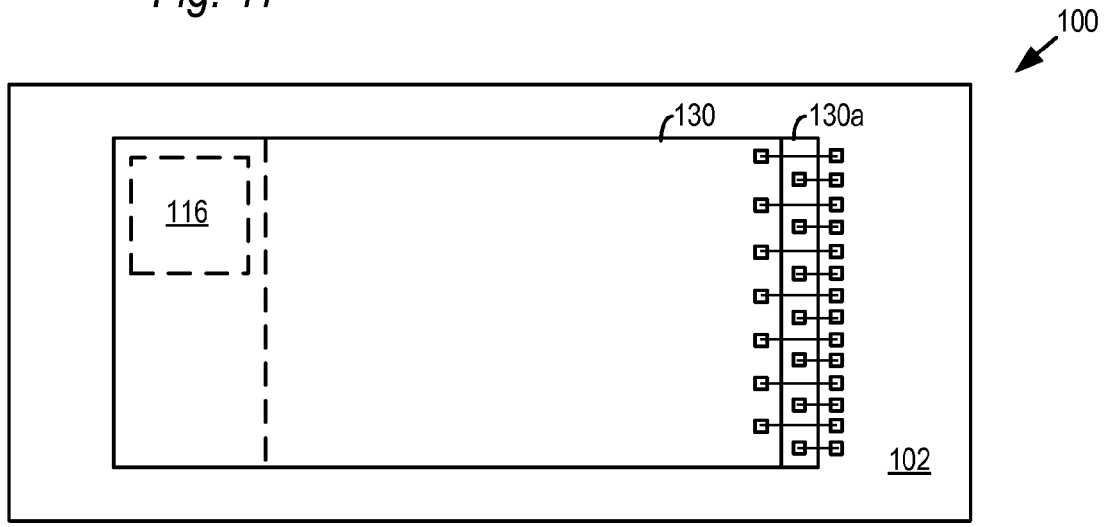
FIG. 17 is a top view of a semiconductor package according to the embodiment of FIG. 15, further including a second memory die mounted atop the controller and first memory die.

Thereafter, as shown in FIGS. 16 and 17, one or more additional full-size memory die 130 may be mounted on top of the controller die and the bottom memory die 130a. These one or more additional memory die 130 may be wire bonded to the substrate 102 as described above, and then the package may be encapsulated and singulated as described above. The memory die 130a and one or more additional memory die 130 may be mounted in an offset or directly overlapping arrangement. Where directly overlapping, a spacer layer may be provided between the memory die to allow wire bonding out to the substrate.

In the above-described embodiments, the controller die 116 is mounted in a flip chip arrangement while the memory die are wire bonded to the substrate. In an alternative embodiment shown in FIG. 18, a memory die 130b may include a cluster of die bond pads 118 having solder bumps so that the memory die 130b may be mounted and electrically coupled to the substrate 102 in a flip chip arrangement. Thereafter, as shown in FIGS. 19 and 20, one or more additional memory die 130 may be mounted on top of the memory die 130b and wire bonded to the substrate 102. A controller die 116 may then be mounted to a top of the memory die stack and wire bonded to the substrate 102.

Figure 15:
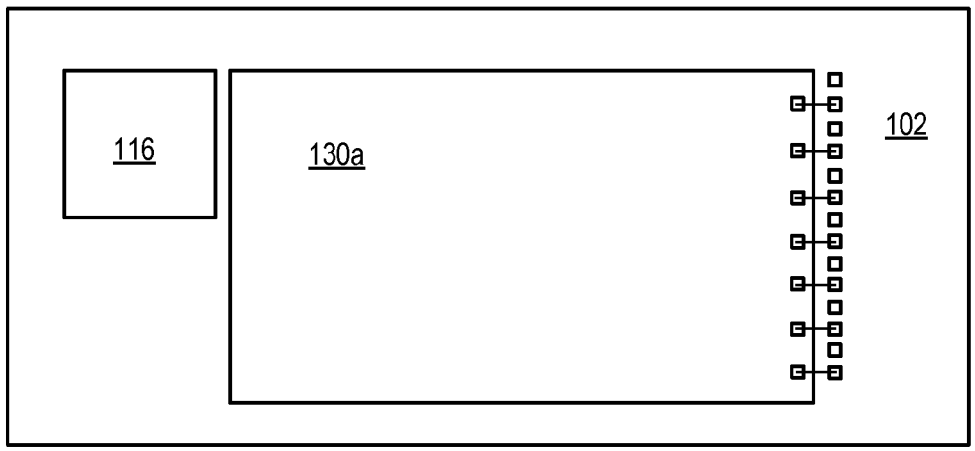
FIG. 15 is a top view of an alternative embodiment of a semiconductor package during the fabrication process including a controller and a flash memory die mounted to the substrate.
Figure 18:
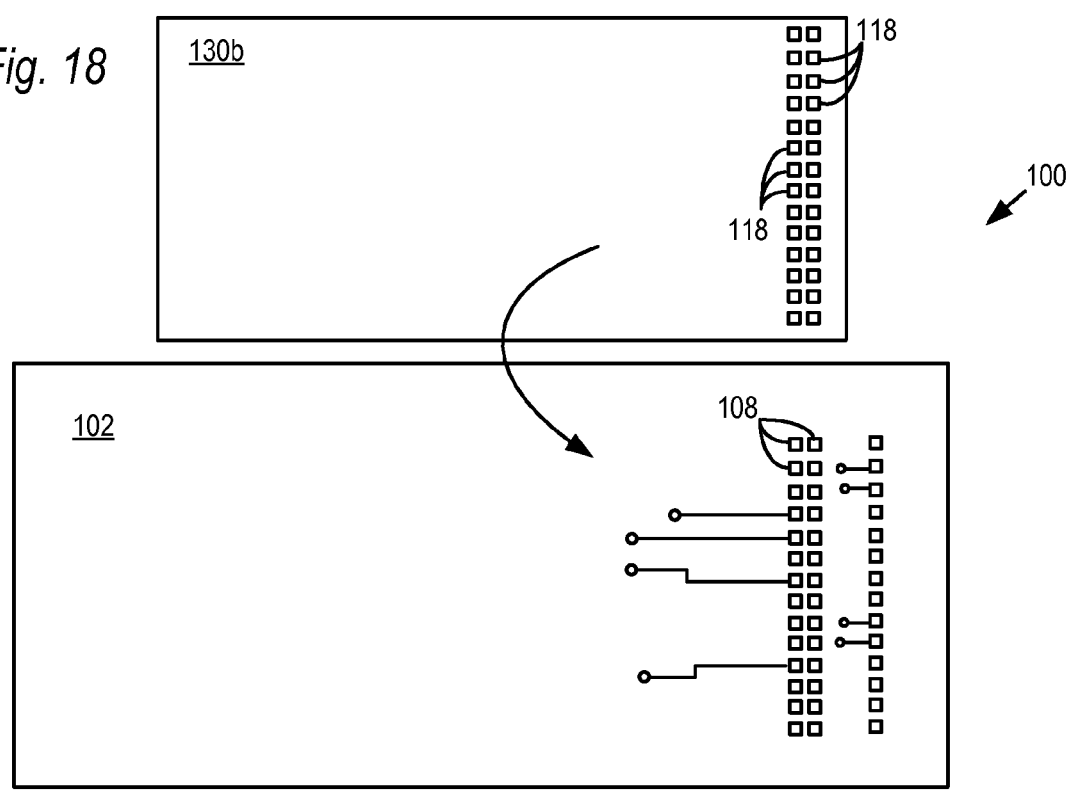
FIG. 18 is a top view of a further alternative embodiment of a semiconductor package during the fabrication process including a flash memory die mounted to the substrate in a flip chip configuration.
Figure 19:
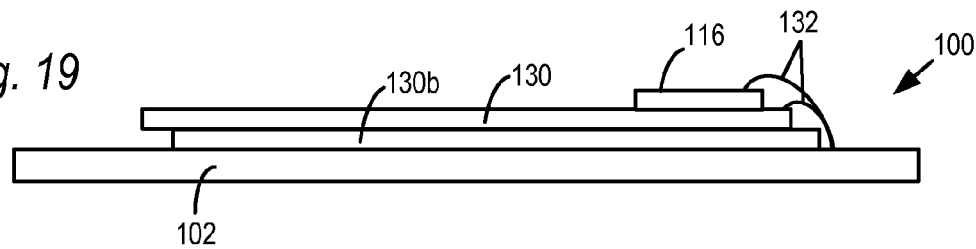
FIG. 19 is a side view of a semiconductor package according to the embodiment of FIG. 18, further including a second memory die and a controller die mounted atop the first memory die.
Figure 20:
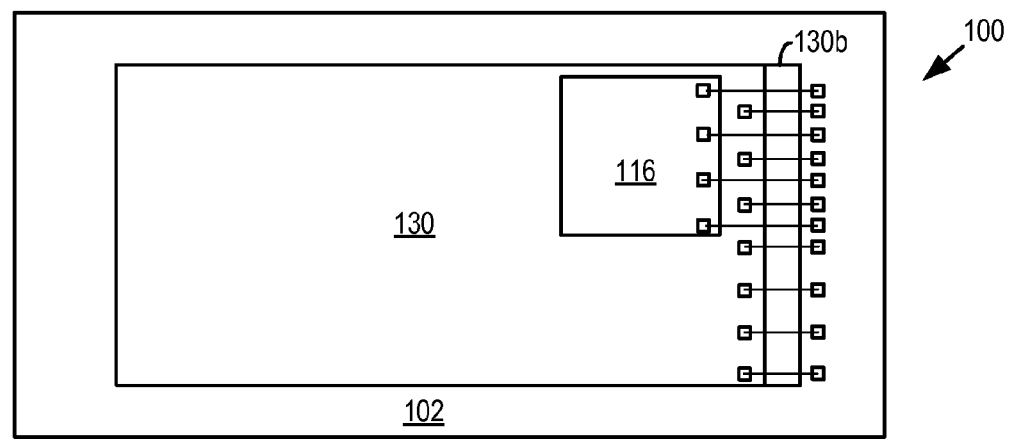
FIG. 20 is a top view of a semiconductor package according to the embodiment of FIG. 18, further including a second memory die and a controller die mounted atop the first memory die.

It is further understood that the embodiments of FIGS. 15-17 and the embodiments of FIGS. 18-20 may be combined so that a controller die and a memory die are mounted and electrically coupled to the substrate side-by-side in a flip chip arrangement. Thereafter, one or more memory die may be stacked on top of the controller and memory flip chips. The one or more stacked memory die may then be wire bonded to the substrate.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of forming a semiconductor package, comprising the steps of:
   (a) forming a conductance pattern on a surface of a substrate, the conductance pattern including a cluster of contact pads;
   (b) affixing a controller die to the surface of the substrate in a flip chip arrangement with a cluster of die bond pads on the controller die electrically coupling with the cluster of contact pads on the substrate;
   (c) affixing a first flash memory die directly to the surface of the substrate, the first flash memory die positioned next to the controller die;
   (d) affixing at least a second flash memory die on top of the controller die and first flash memory die bonded in said steps (b) and (c);
   (e) wirebonding the at least second flash memory die affixed in said step (d) to the substrate;
   (f) encapsulating the flip chip controller die, the first flash memory die and the at least second flash memory die in a molding compound and wherein said step (c) comprises the step of wire bonding the first flash memory die to the substrate.

2. A method as recited in claim 1, said step (c) comprising the step of affixing the first flash memory die to the substrate with a flip-chip electrical bond.

3. A method as recited in claim 1, further comprising the step (f) of mounting a flash memory die to the substrate side-by-side with the controller die.

4. A method as recited in claim 1, the step (f) of mounting a flash memory die to the substrate side-by-side with the controller die comprising the step of mounting the flash memory die to the substrate in a flip chip arrangement.

5. A method as recited in claim 1, the step (f) of mounting a flash memory die to the substrate side-by-side with the controller die comprising the step of mounting the flash memory die to the substrate by wire bonding the flash memory die to the substrate.

6. A method as recited in claim 1, said step (b) of affixing a semiconductor die to the surface of the substrate in a flip chip arrangement comprising the step of affixing a flash memory die to the substrate in a flip chip arrangement.

7. A method as recited in claim 6, said step (c) of affixing one or more additional semiconductor die on top of the flash memory die comprises the step of mounting one or more additional flash memory die and a controller die on top of the flip chip flash memory die.

8. A method of forming a semiconductor package, comprising the steps of:
(a) forming a conductance pattern on a surface of a substrate, the conductance pattern including a cluster of contact pads;
(b) affixing a controller die to the surface of the substrate in a flip chip arrangement with a cluster of die bond pads on the controller die electrically coupling with the cluster of contact pads on the substrate;
(c) affixing a first flash memory die to the substrate next to the controller die affixed in said step (b);
(d) affixing at least a second flash memory die on top of the controller die and first flash memory die affixed in said steps (b) and (c), the at least second flash memory die being the same type of semiconductor die as the first flash memory die but the at least second flash memory die having a length greater than a length of the first flash memory die;
(e) wirebonding the at least a second flash memory die affixed in said step (d) to the substrate;
(f) encapsulating the controller die and flash memory die in a molding compound and wherein said step (c) comprises the step of wire bonding the first flash memory die to the substrate.

9. A method as recited in claim 8, further comprising the step (g) of mounting a flash memory die to the substrate side-by-side with the controller die.

10. A method as recited in claim 9, the step (g) of mounting a flash memory die to the substrate side-by-side with the controller die comprising the step of mounting the flash memory die to the substrate in a flip chip arrangement.

11. A method as recited in claim 9, the step (g) of mounting a flash memory die to the substrate side-by-side with the controller die comprising the step of mounting the flash memory die to the substrate by wire bonding the flash memory die to the substrate.

12. A method as recited in claim 8, said step (c) comprising the step of electrically coupling the first flash memory die to the substrate via flip-chip bonding.

13. A method as recited in claim 8, said steps (b) and (c) of affixing a controller die and a first flash memory die to the substrate comprising the steps of affixing a controller die and first flash memory die having a footprint of approximately the same size as the at least second flash memory die to be mounted on the controller die and first flash memory die.

14. A method as recited in claim 8, said steps (b) and (c) of affixing the controller die and the first flash memory die to the substrate comprising the steps of affixing the controller die and the first flash memory die having a footprint that is larger than size of the at least second flash memory die to be mounted on the controller die and the first flash memory die.

15. A method as recited in claim 8, said steps (b) and (c) of affixing the controller die and the first flash memory die to the substrate comprising the steps of affixing the controller die and the first flash memory die having a footprint that is smaller than a size of the at least second flash memory die to be mounted on the controller die and the first flash memory die.

* * * * *

UNITED STATES PATENT AND TRADEMARK OFFICE
CERTIFICATE OF CORRECTION

PATENT NO. : 7,867,819 B2
APPLICATION NO. : 11/965702
DATED : January 11, 2011
INVENTOR(S) : Upadhyayula et al.

It is certified that error appears in the above-identified patent and that said Letters Patent is hereby corrected as shown below:

Col. 9, line 23 (claim 8): after "a molding compound" delete "and wherein said step (c) comprises the step of wire bonding the first flash memory die to the substrate"

Col. 9, lines 26-28 (claim 9): after "claim 8" delete "further comprising the step (g) of mounting a flash" and substitute -- wherein said step (c) comprises the step of mounting the flash --

Col. 9, line 29 (claim 10): after "step" delete "(g)" and replace with -- (c) --

Col. 10, line 3 (claim 11): after "step" delete "(g)" and replace with -- (c) --

Signed and Sealed this
Third Day of January, 2012

David J. Kappos
*Director of the United States Patent and Trademark Office*